(12) United States Patent
Lin et al.

(10) Patent No.: US 11,757,156 B2
(45) Date of Patent: Sep. 12, 2023

(54) BATTERY CONNECTION MODULE

(71) Applicant: Molex, LLC, Lisle, IL (US)

(72) Inventors: Yong Lin, ChengDu (CN); Kian-Heng Lim, Jurong Town (SG); Shang-Xiu Zeng, ChengDu (CN)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 17/406,374

(22) Filed: Aug. 19, 2021

(65) Prior Publication Data

US 2022/0069424 A1  Mar. 3, 2022

(30) Foreign Application Priority Data

Aug. 27, 2020 (CN) .......................... 202010876773.1

(51) Int. Cl.
| | |
|---|---|
| *H01M 50/519* | (2021.01) |
| *H01R 13/516* | (2006.01) |
| *H01R 13/50* | (2006.01) |
| *H01M 50/256* | (2021.01) |
| *H01M 50/51* | (2021.01) |
| *H01M 50/209* | (2021.01) |
| *H05K 1/18* | (2006.01) |

(52) U.S. Cl.
CPC ....... *H01M 50/519* (2021.01); *H01M 50/209* (2021.01); *H01M 50/256* (2021.01); *H01M 50/51* (2021.01); *H01R 13/50* (2013.01); *H01R 13/516* (2013.01); *H05K 1/189* (2013.01); *H05K 2201/10189* (2013.01)

(58) Field of Classification Search
CPC ............. H01M 50/519; H01M 50/209; H01M 50/256; H01M 50/51; H01M 50/507; H01R 13/50; H01R 13/516; H05K 1/189
See application file for complete search history.

(56) References Cited

U.S. PATENT DOCUMENTS

| | | |
|---|---|---|
| 2011/0258845 A1 | 10/2011 | Wells et al. |
| 2015/0104689 A1 | 4/2015 | Frias et al. |
| 2016/0372801 A1 | 12/2016 | Clemente et al. |
| 2019/0081311 A1* | 3/2019 | Zeng ................... H01R 12/774 |
| 2019/0305271 A1* | 10/2019 | Cao ................... H01M 10/0481 |

FOREIGN PATENT DOCUMENTS

| | | |
|---|---|---|
| CN | 108899593 A | 11/2018 |
| CN | 209104222 U | 7/2019 |

* cited by examiner

*Primary Examiner* — Niki Bakhtiari
*Assistant Examiner* — Bartholomew A Hornsby (57) ABSTRACT

A battery connection module of the present disclosure includes a carrying tray, a plurality of busbars, a flexible circuit board, a connector and a connector box. The flexible circuit board is provided to the carrying tray. The connector is provided at an end of the flexible circuit board, the connector includes a connector housing and a plurality of conductive terminals which are provided in the connector housing and electrically and mechanically connected to the flexible circuit board, the connector housing has a mating portion at a front end thereof, a base at a rear end thereof and a rear supporter protruding rearwardly from the base. The connector box is constructed to one end of the carrying tray and receives the connector, the connector box includes a bottom wall, two side walls and an upper opening which allows the connector to be assembled therein.

20 Claims, 13 Drawing Sheets

BATTERY CONNECTION MODULE

RELATED APPLICATIONS

The present application claims priority to Chinese Patent Application No. 202010876773.1 filed Aug. 27, 2020 which is incorporated by reference in its entirety.

TECHNICAL FIELD

The present disclosure relates to a battery connection module, and in particular relates to a battery connection module for a vehicle-mounted power battery.

BACKGROUND

Chinese utility model application issuance publication No. CN209104222U (corresponding to WIPO patent application publication No. WO2020/135029A1) discloses a battery module, a fastening base of the battery module has a first mounting portion and a second mounting portion, a connector is fixedly mounted to the first mounting portion, and an output pole connecting sheet is fixedly mounted to the second mounting portion. The first mounting portion of the fastening base has a first bottom wall, a first front wall, a first rear wall, an opening provided to the first front wall and/or the first rear wall and an elastic clasp cantilevered in the opening. When the connector is placed in a receiving cavity formed by the first bottom wall, the first front wall, the first rear wall and a partition wall, the elastic clasp can clamp the connector together with the first rear wall and/or the first front wall.

However, because the connector is subjected to various forces, such as inserting, pulling, pushing, dragging, shaking and the like, during use, this prior art only uses an elastic force of the elastic clasp to clamp the connector, resulting in that the connector is not stable enough and the structure used to be subjected to the force is weak, and because the fastening base is integrally connected to a carrying tray, if assembling of the connector is not stable enough, it will affect and damage a flexible circuit board, a tray, an electric connection piece on the tray welded with the battery, or even the assembly of the whole batteries, thereby reducing the service life of the battery module.

SUMMARY

Therefore, an object of the present disclosure is to provide a battery connection module which can improve at least one of deficiencies in the prior art.

Accordingly, in some embodiments, a battery connection module of the present disclosure comprises a carrying tray, a plurality of busbars, a flexible circuit board, a connector and a connector box. The plurality of busbars are provided to the carrying tray. The flexible circuit board is provided to the carrying tray and electrically and mechanically connected to the plurality of busbars. The connector is provided at an end of the flexible circuit board, the connector comprises a connector housing and a plurality of conductive terminals which are provided in the connector housing and electrically and mechanically connected to the flexible circuit board, the connector housing has a mating portion at a front end thereof, a base at a rear end thereof and a rear supporter protruding rearwardly from a rear end surface of the base, the rear end surface of the base and the rear supporter together define a circuit board receiving recess which is capable of partially receiving the flexible circuit board. The connector box is constructed to one end of the carrying tray and receives the connector, the connector box comprises a bottom wall, two side walls, a front opening which is defined by the bottom wall and the two side walls together and corresponds to the mating portion of the connector and an upper opening which allows the connector to be assembled therein. A first holding structure is provided between the base of the connector housing and the two side walls of the connector box, a second holding structure is provided between the rear supporter of the connector housing and the connector box, and a third holding structure is provided between the connector housing and the connector box to prevent the connector from detached via the upper opening.

In some embodiments, the second holding structure comprises a rear supporter receiving groove which is formed to the connector box and used to receive the rear supporter.

In some embodiments, the second holding structure further comprises a recessed groove which is formed to a rear end of the rear supporter and a protruding bar which is formed in the rear supporter receiving groove and correspondingly cooperates with the recessed groove.

In some embodiments, the first holding structure comprises two protruding rails which are formed to inner wall surfaces of the two side walls of the connector box and two protruding rail cooperate grooves which are formed to two side surfaces of the base and correspondingly cooperate with the two protruding rails.

In some embodiments, lower ends of the two protruding rail cooperate grooves are opened and upper ends of the two protruding rail cooperate grooves are closed.

In some embodiments, the third holding structure comprises a latching block which is formed to a side surface of the rear supporter and a latched hole which is formed to an inner wall surface of the side wall of the connector box and correspondingly cooperates with the latching block.

In some embodiments, the connector box is formed with a circuit board receiving groove which is used to partially receive the flexible circuit board.

In some embodiments, the battery connection module further comprises an end plate positioned below the bottom wall of the connector box, the end plate has a hollow structure and has a plurality of partitioning ribs and a first hollow groove and a second hollow groove which are partitioned by the plurality of partitioning ribs, the bottom wall of the connector box has a first protruding portion and a second protruding portion which are respectively received in the first hollow groove and the second hollow groove of the end plate and a limiting groove which is defined by the first protruding portion and the second protruding portion together and receives the partitioning rib between the first hollow groove and the second hollow groove.

In some embodiments, the first protruding portion constitutes a protruding structure having three sides, the first hollow groove constitutes a groove structure having three sides, the second protruding portion corresponds to one of the three sides of the first protruding portion and forms a linear protruding structure.

Accordingly, in some embodiments, a battery connection module of the present disclosure comprises a carrying tray, a plurality of busbars, a flexible circuit board, a connector, a connector box and an end plate. The plurality of busbars are provided to the carrying tray. The flexible circuit board is provided to the carrying tray and electrically and mechanically connected to the plurality of busbars. The connector is provided at an end of the flexible circuit board, the connector comprises a connector housing and a plurality of conductive terminals which are provided in the connector housing and electrically and mechanically connected to the flexible circuit board. The connector box is constructed to one end of the carrying tray and receives the connector, the connector box comprises a bottom wall, two side walls, a front opening which is defined by the bottom wall and the two side walls together and corresponds to the mating portion of the connector and an upper opening which allows the connector to be assembled therein. The end plate is positioned below the bottom wall of the connector box, the end plate has a hollow structure and has a plurality of partitioning ribs and a hollow groove partitioned by the plurality of partitioning ribs, the bottom wall of the connector box has a protruding portion, the protruding portion is received in the hollow groove of the end plate.

In some embodiments, the protruding portion comprises a first protruding portion and a second protruding portion, the bottom wall of the connector further has a limiting groove which is defined by the first protruding portion and the second protruding portion together, the hollow groove comprises a first hollow groove and a second hollow groove which respectively receive the first protruding portion and the second protruding portion, the limiting groove receives the partitioning rib between the first hollow groove and the second hollow groove.

In some embodiments, the first protruding portion constitutes a protruding structure having three sides, the first hollow groove constitutes a groove structure having three sides.

In some embodiments, the second protruding portion corresponds to one of the three sides of the first protruding portion and forms a linear protruding structure.

In the present disclosure, by the first holding structure which is positioned between the connector housing and the two side walls of the connector box and positioned in the front, the second holding structure which is positioned between the rear supporter of the connector housing and the connector box and positioned at the rear, and the third holding structure which is positioned between the connector housing and the connector box and prevents the connector from being detached via the upper opening, a complete and stable holding structure is constructed, the assembling strength and stability of the connector assembled in the connector box is increased. Furthermore, by corresponding cooperating relationships between the protruding portion and the limiting groove of the bottom wall of the connector box and the hollow groove and the partitioning rib of the end plate, the connector box together with the carrying tray can be better positioned, and at the same time, the endurance strength and stability of the connector box are increased.

BRIEF DESCRIPTION OF THE DRAWINGS

Other features and technical effects of the present disclosure will be apparent in an embodiment referring to the accompanying FIG.s, in which.

DETAILED DESCRIPTION OF THE PREFERRED EMBODIMENTS

Figure 1:
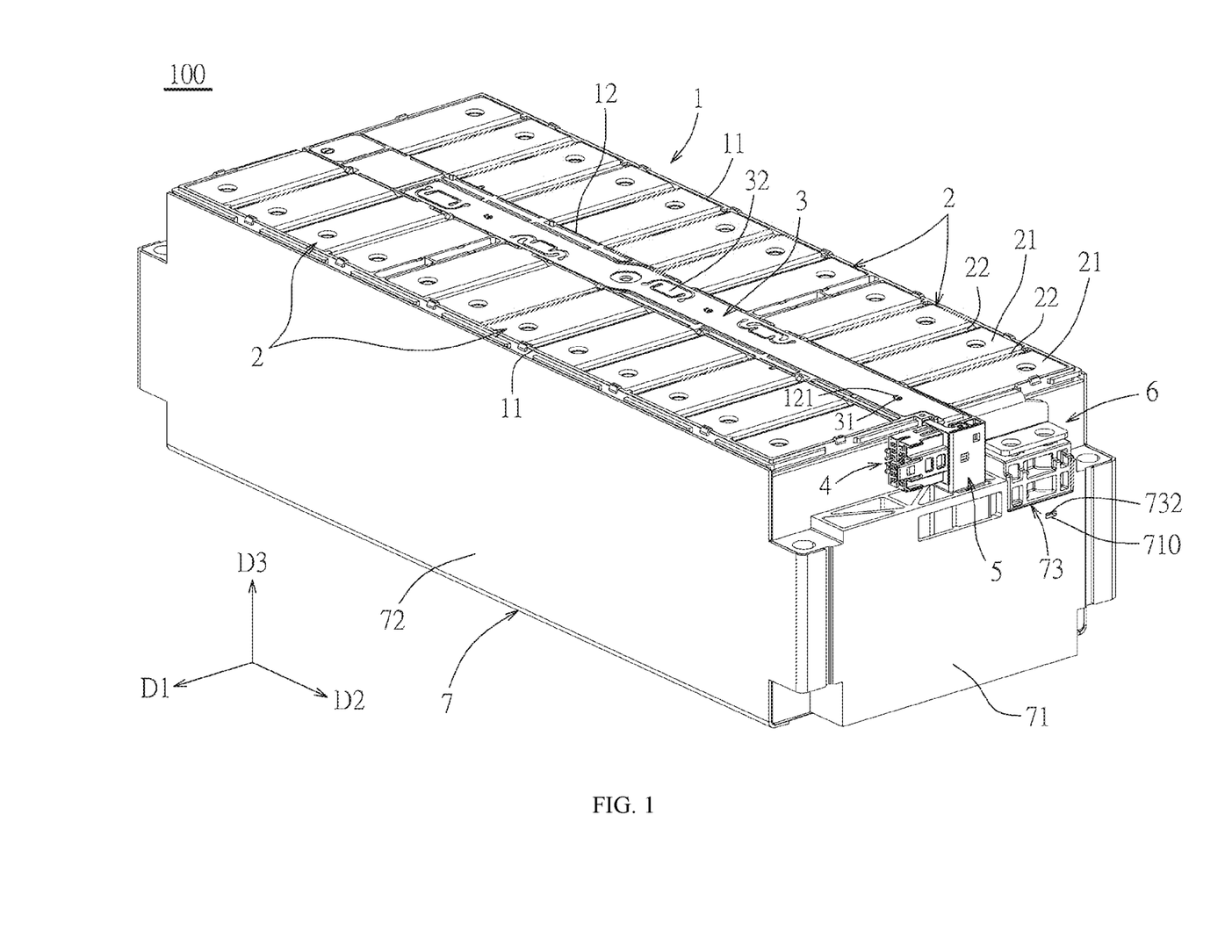
FIG. 1 is a perspective view of an embodiment of a battery connection module of the present disclosure.
Figure 2:
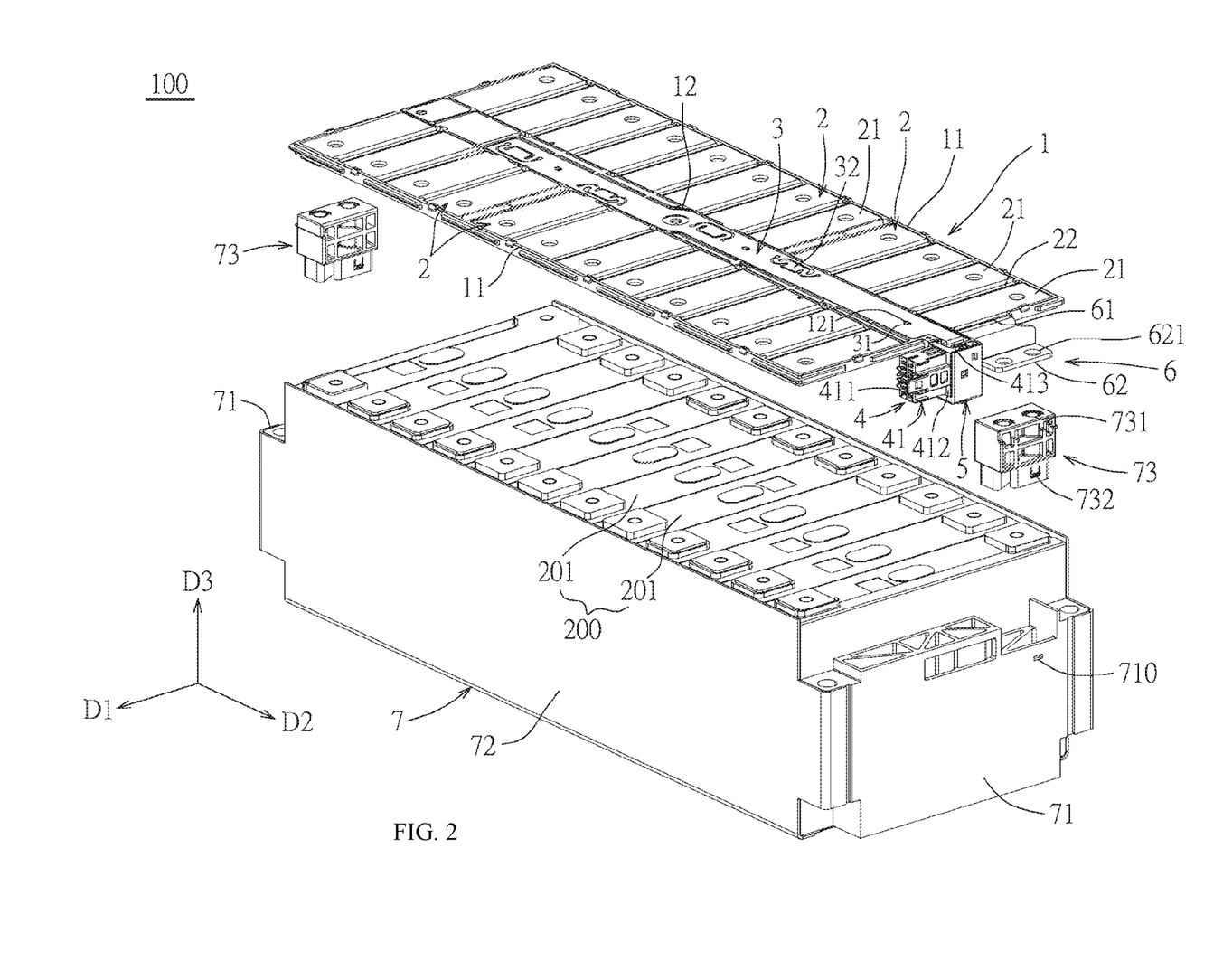
FIG. 2 is a perspective exploded view of FIG. 1.
Figure 3:
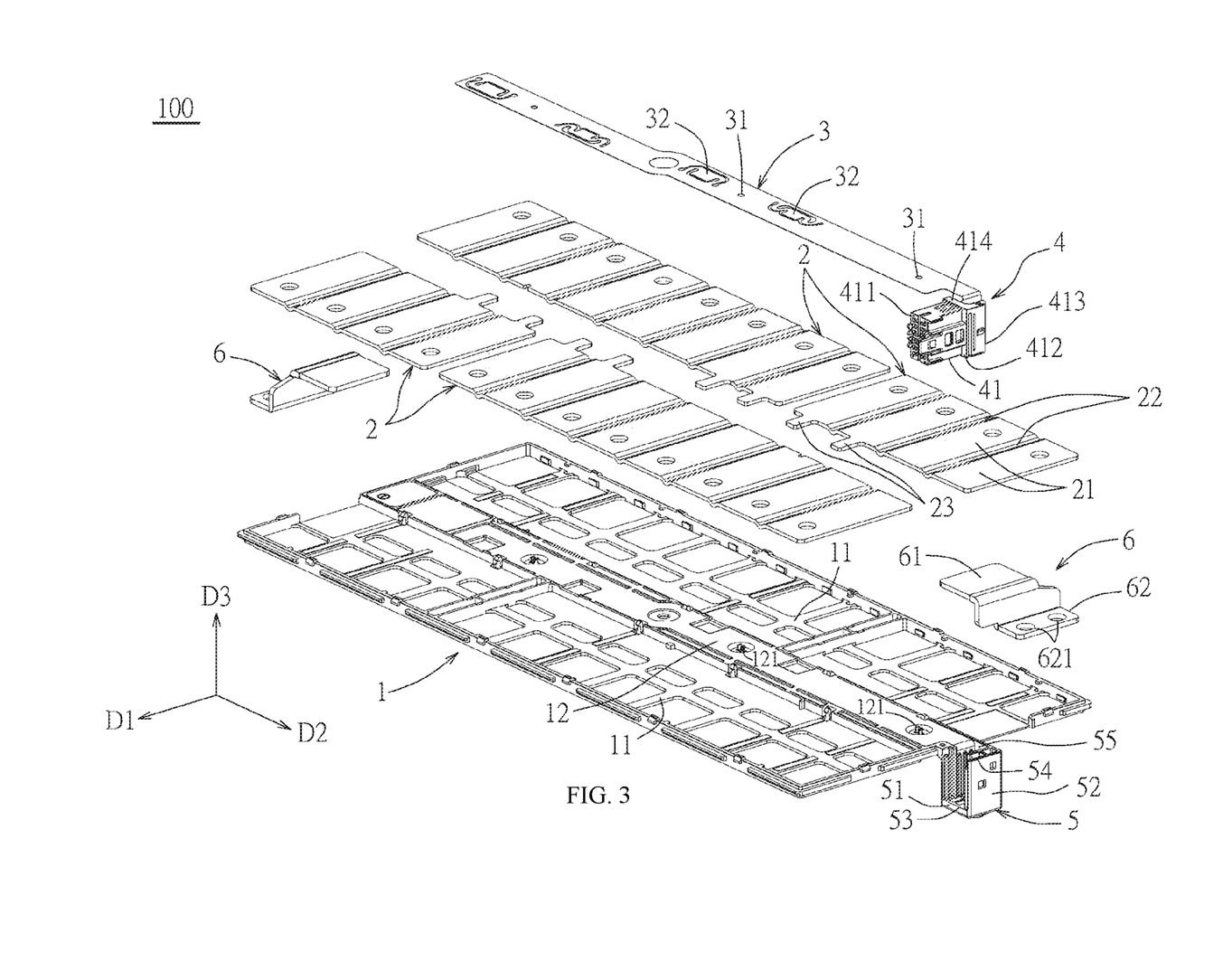
FIG. 3 is a further perspective schematic view based on FIG. 2.
Figure 4:
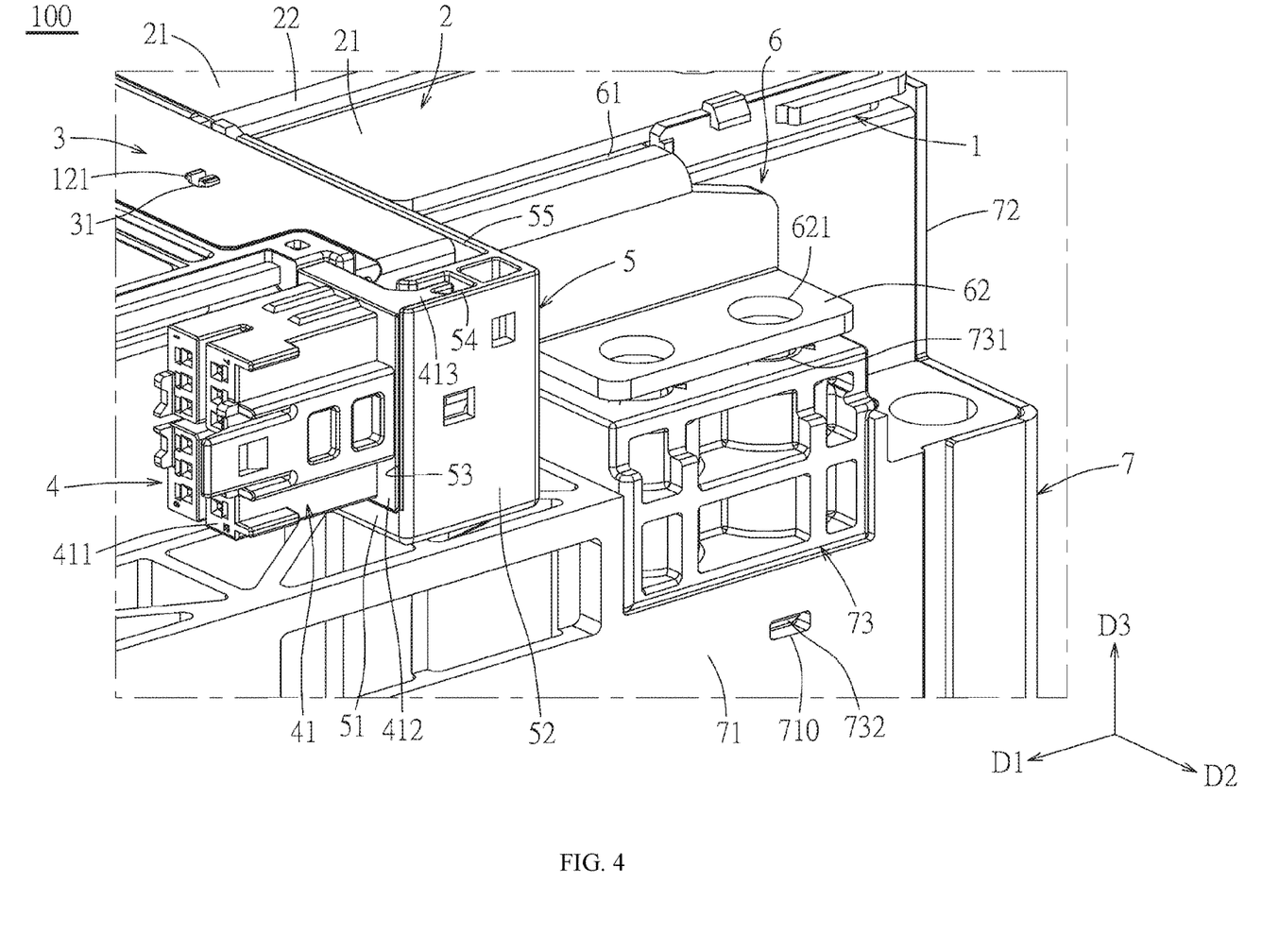
FIG. 4 is a partially enlarged perspective view of the embodiment.
Figure 5:
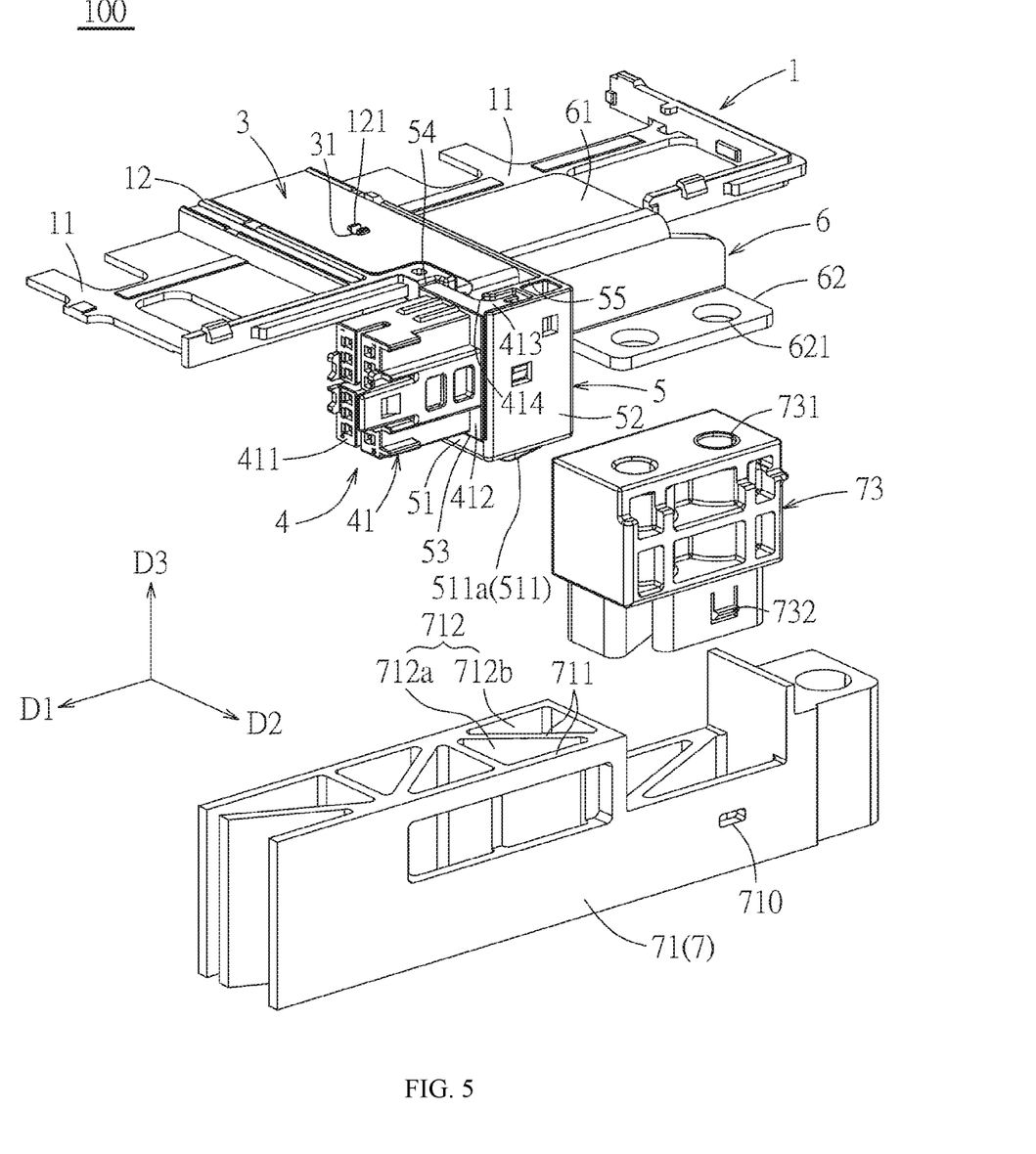
FIG. 5 is a partial perspective exploded view based on FIG. 4.
Figure 6:
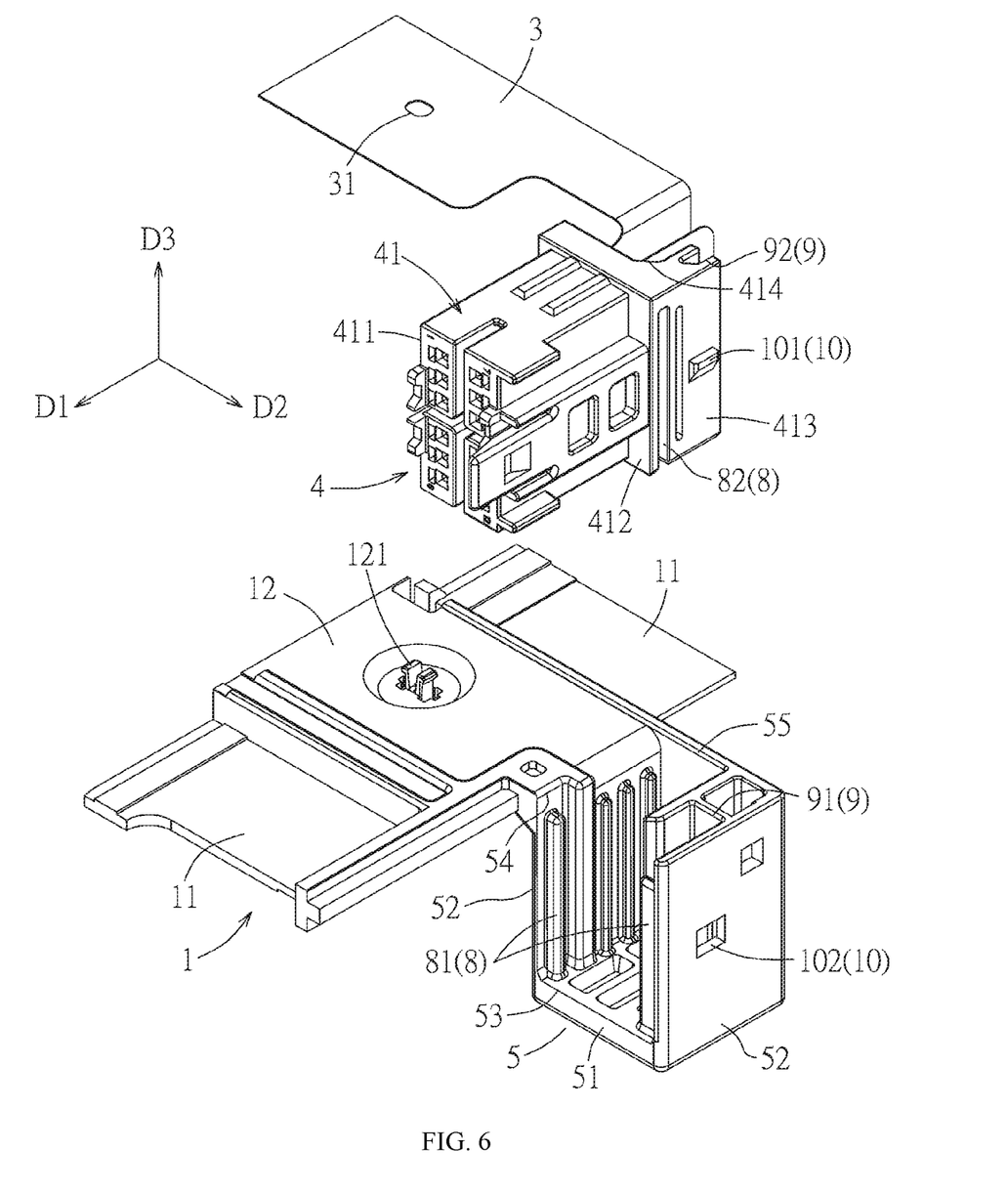
FIG. 6 is a perspective exploded view of a connector and a connector box of the embodiment.
Figure 7:
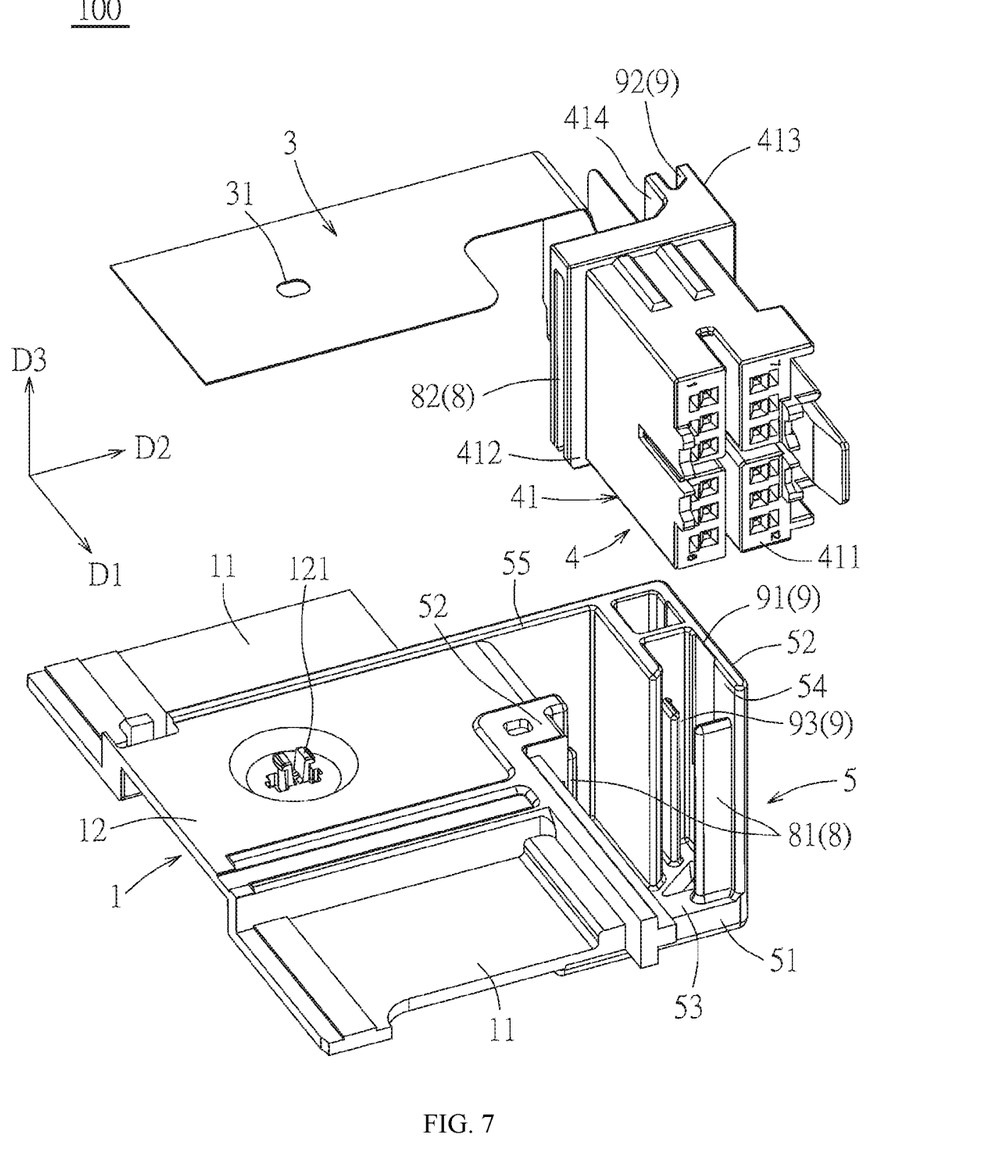
FIG. 7 is a perspective exploded view of the connector and the connector box of the embodiment in FIG. 6 viewed from another angle.
Figure 8:
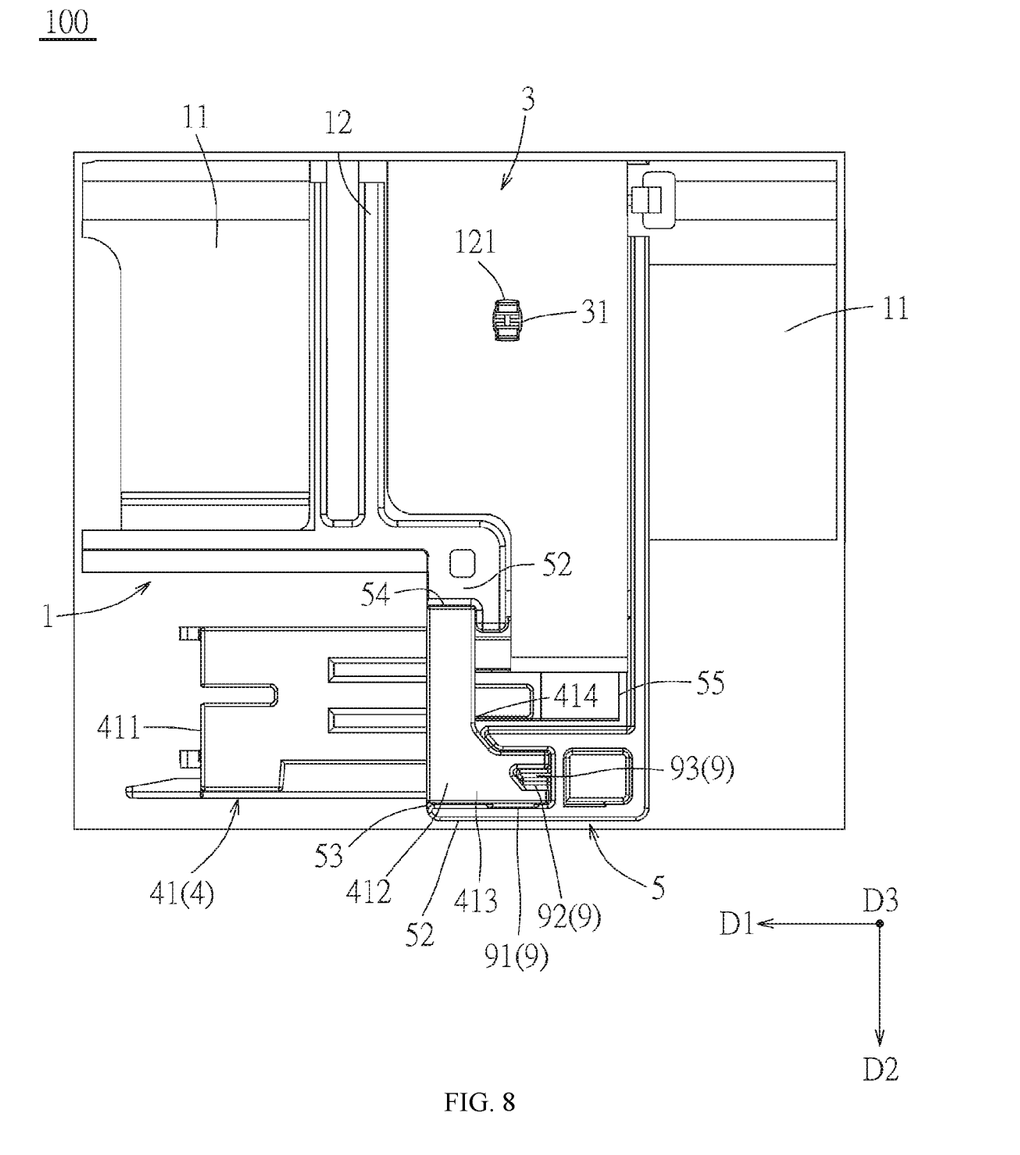
FIG. 8 is a partially enlarged top view of the connector and the connector box of the embodiment.
Figure 9:
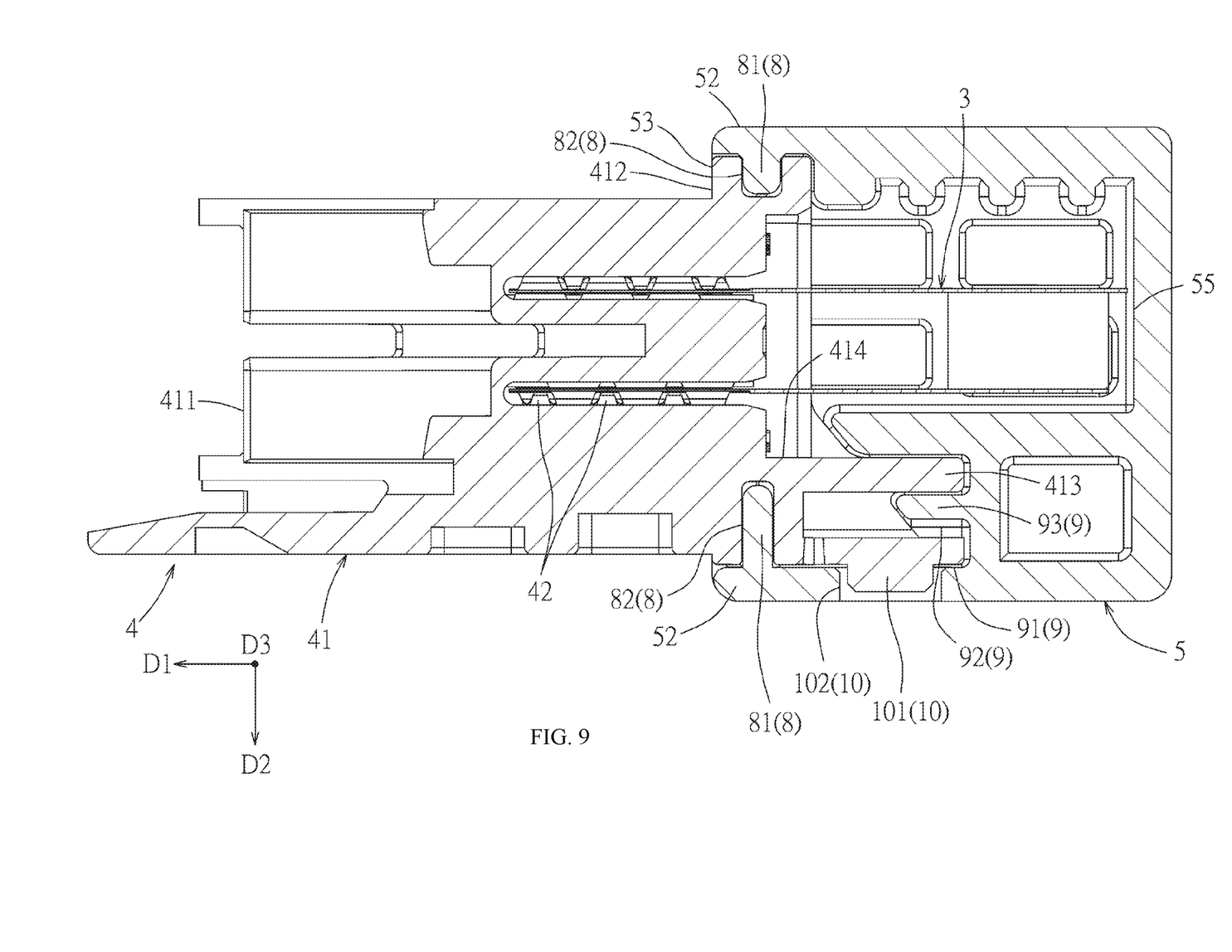
FIG. 9 and FIG. 10 are a partial cross-sectional view of the connector and the connector box of the embodiment.

Referring to FIG. 1 to FIG. 3, an embodiment of a battery connection module 100 of the present disclosure is adapted to be electrically connected to a battery set 200, the battery set 200 has a plurality of batteries 201. In the embodiment, the plurality of batteries 201 are arranged in one row. The battery set 200 is received in a battery receiving shell 7. The battery receiving shell 7 has two end plates 71 positioned at two ends thereof and two side plates 72 positioned at two sides thereof and connected between the two end plates 71. The battery connection module 100 includes a carrying tray 1, a plurality of busbars 2, a flexible circuit board 3, a connector 4 and a connector box 5.

The carrying tray 1 extends in a front-rear direction D1 (in which an arrow pointing direction is front and an opposite direction is rear) and a left-right direction D2 (in which an arrow pointing direction is right and an opposite direction is left), is adapted to be provided on the battery set 200 in an up-down direction D3 (in which an arrow pointing direction is up and an opposite direction is down), and is made of an insulating material. The carrying tray 1 has two busbar mounting portions 11 which each extend along the left-right direction D2 and which are spaced apart from each in the front-rear direction D1 and are arranged side by side in the front-rear direction D1 and a circuit board mounting portion 12 which extends along the left-right direction D2 and positioned between the two busbar mounting portions 11. The plurality of busbars 2 are arranged along the left-right direction D2, divided into two rows in the front-rear direction D1, and respectively correspondingly provided to the two busbar mounting portions 11 of the carrying tray 1. Each busbar 2 has a plurality of battery connection portions 21 which are arranged along the left-right direction D2 and adapted to be connected with electrodes of the corresponding batteries 201, a plurality of buffering portions 22 which each are positioned between two adjacent battery connection portions 21, budge upwardly and extend along the front-rear direction D1, and two circuit board connecting portions 23 which extend from the plurality of battery connection portions 21 toward the circuit board mounting portion 12 of the carrying tray 1. The battery connection portion 21 may be connected with the electrode of the corresponding battery 201 for example by welding. In addition, it is noted that, in other varied embodiments, the battery connection portions 21 may be two or more in number.

Referring to FIG. 1 to FIG. 5, the plurality of busbars 2 are used to connect the plurality of batteries 201 of the battery set 200 in series, two busbars 2 positioned at tips of the in-series connection in the plurality of busbars 2 are respectively connected with two output connection pieces 6 at bottom surfaces of the two busbars 2, and the two output connection pieces 6 are respectively positioned at two ends of the carrying tray 1 in the left-right direction D2. The two end plates 71 of the battery receiving shell 7 are respectively assembled with two supporting fixing members 73 which correspondingly support the two output connection pieces 6 respectively. Each output connecting member 6 has a connecting portion 61 which is connected to the corresponding busbar 2 and an outputting portion 62 which corresponds to the supporting fixing member 73. The outputting portion 62 is formed with two through holes 621, a top surface of each supporting fixing member 73 is formed with two screw holes 731 corresponding to the two through holes 621 respectively, the two through holes 621 and the two screw holes 731 may lock and fix an electrical wire with two screw locking members (not shown). In addition, each end plate 71 is formed with two latching holes 710 which are positioned at two sides of the each end plate 71 in the left-right direction D2, each supporting fixing member 73 is inserted and assembled to the end plate 71 and has two latching blocks 732 which are respectively used to latch with the two latching holes 710, so that the two supporting fixing members 73 are assembled and fixed to the two end plates 71 respectively.

Figure 10:
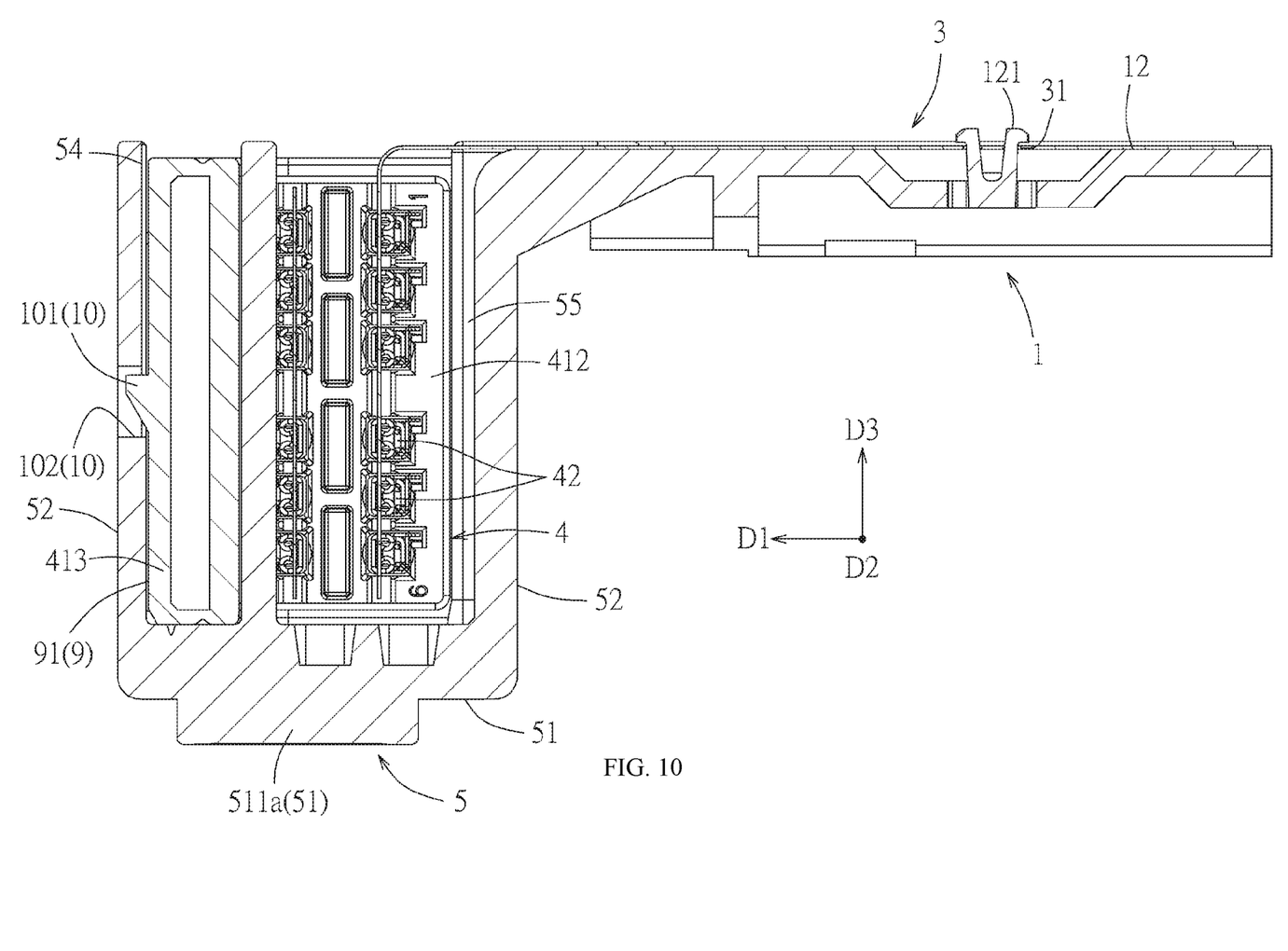
Figure 11:
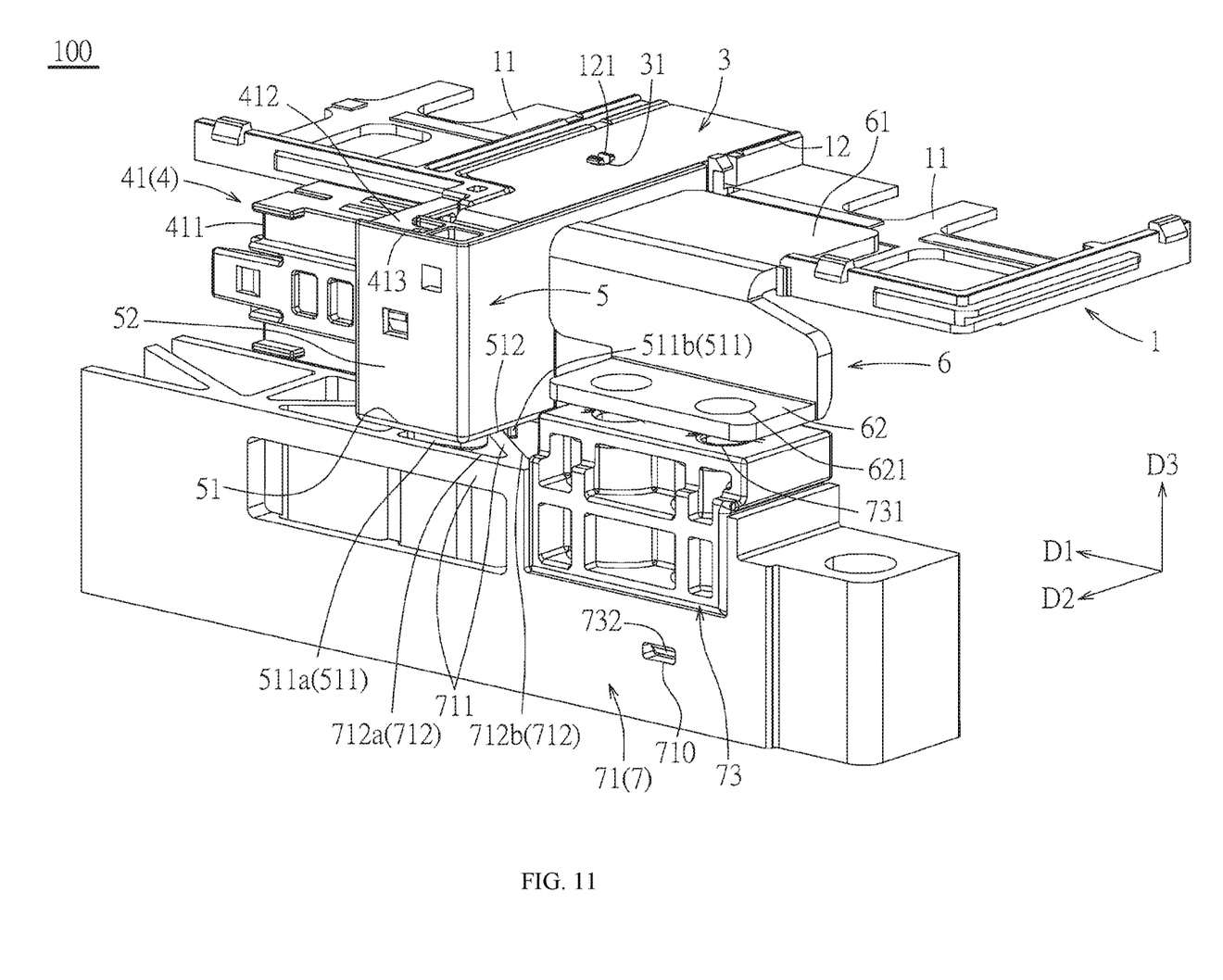
FIG. 11 is a partially enlarged perspective view of the embodiment illustrating a relationship between an end plate and the connector box of the embodiment.
Figure 12:
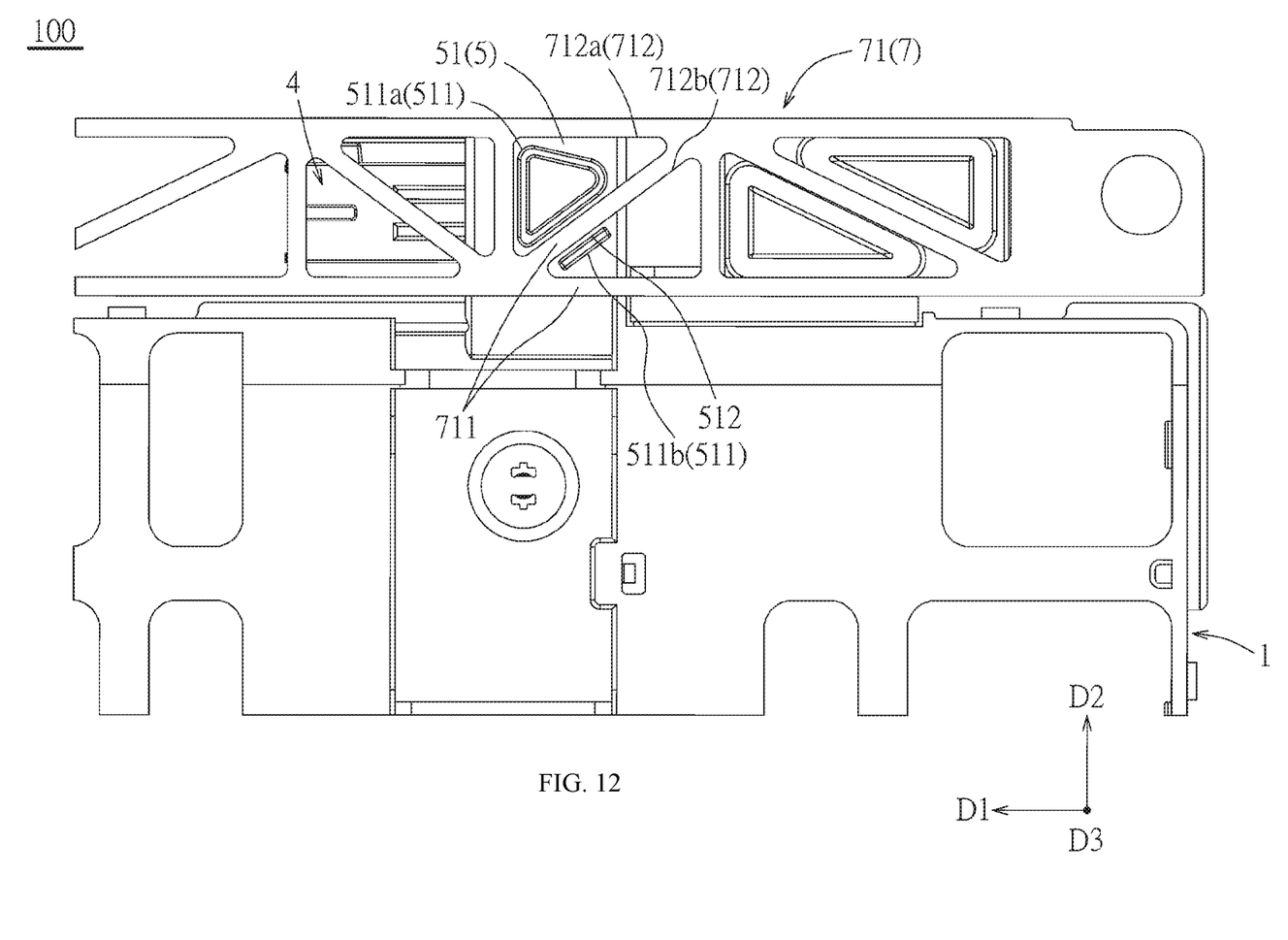
FIG. 12 is a partially enlarged bottom view of the embodiment illustrating the relationship between the end plate and the connector box of the embodiment.
Figure 13:
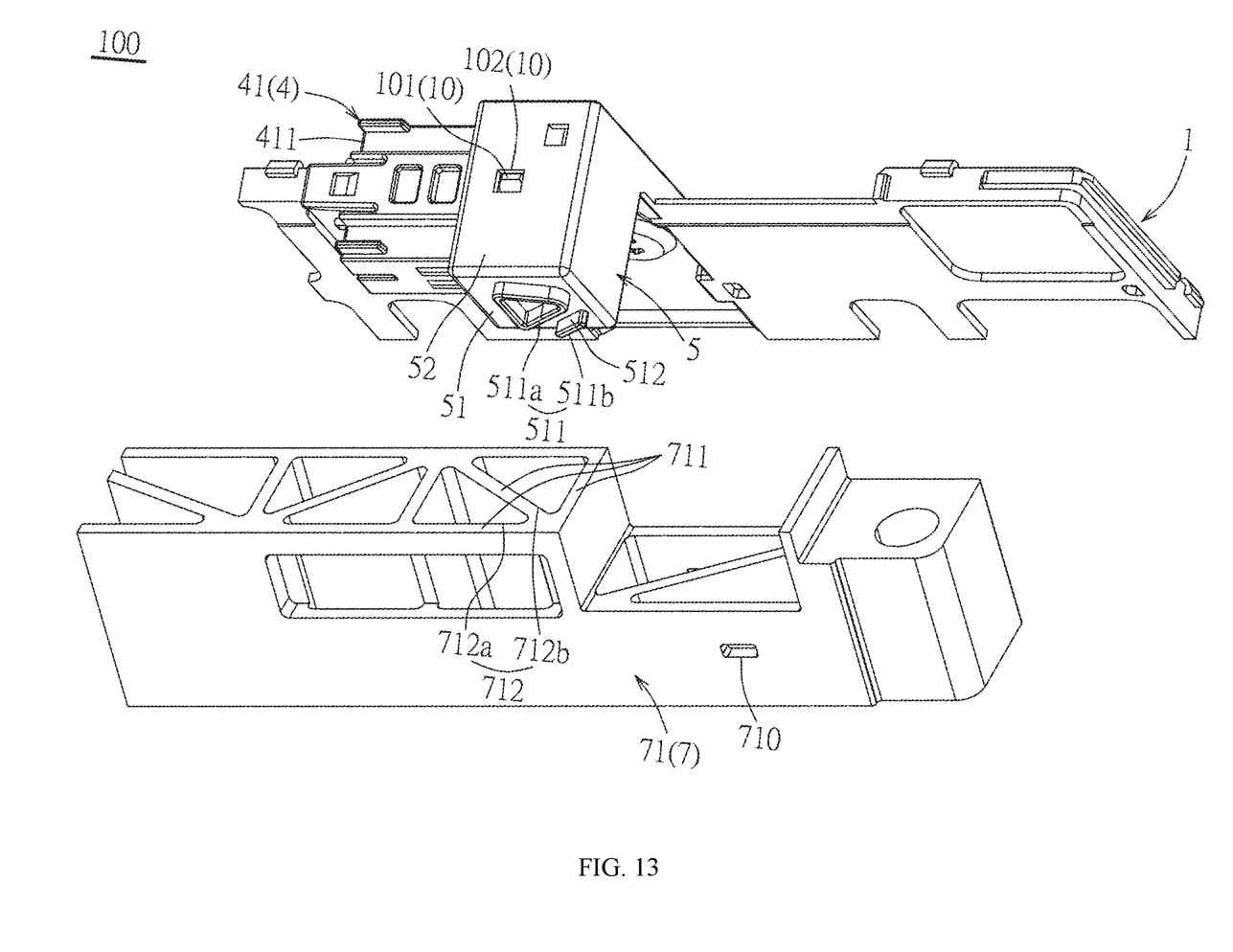
FIG. 13 is a partial perspective exploded view of the embodiment illustrating the relationship between the end plate and the connector box of the embodiment.

Referring to FIG. 5 to FIG. 8, the flexible circuit board 3 is provided on the circuit board mounting portion 12 of the carrying tray 1 and is electrically and mechanically connected to the circuit board connection portions 23 of the plurality of busbars 2. Specifically, a plurality of fixing hook groups 121 are formed on the circuit board mounting portion 12, the flexible circuit board 3 is formed with a plurality of hook holes 31 corresponding to the plurality of fixing hook groups 121 respectively, two hooks of each fixing hook group 121 pass through the corresponding hook hole 31 from below and then splay and abut against an upper surface of the flexible circuit board 3, so that the flexible circuit board 3 is fixedly provided on the circuit board mounting portion 12 of the carrying tray 1. In addition, the flexible circuit board 3 is formed with a plurality of connection sections 32 which are formed by cutting and forming slits and have flexibility, and the plurality of connection sections 32 are respectively used to connect to the circuit board connection portions 23 of the plurality of busbars 2. The flexible circuit board 3 extends along the left-right direction D2. The connector 4 is provided at an end of the flexible circuit board 3 at the right in the left-right direction D2. The connector 4 includes a connector housing 41 and a plurality of conductive terminals 42 which are provided in the connector housing 41 and electrically and mechanically connected to the end of the flexible circuit board 3 (see FIG. 10). The connector housing 41 has a mating portion 411 at a front end thereof, a base 412 at a rear end thereof and a rear supporter 413 protruding rearwardly from a rear end surface of the base 412, the rear end surface of the base 412 and the rear supporter 413 together define a circuit board receiving recess 414 which can partially receive the end of the flexible circuit board 3.

The connector box 5 is integrally constructed to one end of the carrying tray 1 and receives the connector 4. The connector box 5 includes a bottom wall 51, two side walls 52, a front opening 53 which is defined by the bottom wall 51 and the two side walls 52 together and corresponds to the mating portion 411 of the connector 4 and an upper opening 54 which allows the connector 4 to be assembled therein. A first holding structure 8 is provided between the base 412 of the connector housing 41 and the two side walls 52 of the connector box 5. A second holding structure 9 is provided between the rear supporter 413 of the connector housing 41 and the connector box 5. A third holding structure 10 is provided between the connector housing 41 and the connector box 5 to prevent the connector 4 from being detached via the upper opening 54.

Referring to FIG. 6 to FIG. 10, the first holding structure 8 includes two protruding rails 81 which are formed to inner wall surfaces of the two side walls 52 of the connector box 5 and two protruding rail cooperate grooves 82 which are formed to two side surfaces of the base 412 of the connector housing 41 and correspondingly cooperate with the two protruding rails 81 respectively, the two protruding rails 81 and the two protruding rail cooperate grooves 82 are formed in the left-right direction D2 and extend along the up-down direction D3. Lower ends of the two protruding rail cooperate grooves 82 are opened and upper ends of the two protruding rail cooperate grooves 82 are closed, so that positioning and holding function between the connector box 5 and the connector housing 41 can be provided. The second holding structure 9 includes a rear supporter receiving groove 91 which is formed to the connector box 5 and used to receive the rear supporter 413, a recessed groove 92 which is formed at a rear end of the rear supporter 413 and a protruding bar 93 which is formed in the rear supporter receiving groove 91 and correspondingly cooperates with the recessed groove 92, the protruding bar 93 and the recessed groove 92 are formed in the front-rear direction D1 and extend along the up-down direction D3. By that the two protruding rails 81 and the two protruding rail cooperate grooves 82 cooperate with each other, the rear supporter 413 and the rear supporter receiving groove 91 cooperate with each other and the protruding bar 93 and the recessed groove 92 cooperate with each other, the connector housing 41 can be guided after entering into the connector box 5 via the upper opening 54 and can move in the up-down direction D3 to be assembled in the connector box 5.

The third holding structure 10 includes a latching block 101 which is formed to one of side surfaces of the rear supporter 413 and a latched hole 102 which is formed to an inner surface of one of the two side walls 52 of the connector box 5 and correspondingly cooperates with the latching block 101. By that the latching block 101 and the latched hole 102 cooperate with each other, the connector 4 can be prevented from being detached from the connector box 5 via the upper opening 54 after the connector 4 is assembled to and positioned in the connector box 5, so as to achieve a prevent detachment function. It is noted that, the latching block 101 and the latched hole 102 can be adjusted to be two or more in number as desired and are not limited to be formed at one side of the rear supporter 413 or the base 412 and the connector box 5. By the first holding structure 8 which is positioned between the connector housing 41 and the two side walls 52 of the connector box 5 and positioned in the front, the second holding structure 9 which is positioned between the rear supporter 413 of the connector housing 41 and the connector box 5 and positioned at the rear, and the third holding structure 10 which is positioned between the connector housing 41 and the connector box 5 and prevents the connector 4 from being detached via the upper opening 54, a complete and stable holding structure is constructed, the assembling strength and stability of the connector 4 assembled in the connector box 5 is increased.

In addition, in the embodiment, the connector box 5 is formed with a circuit board receiving groove 55 which corresponds to the circuit board receiving recess 414 of the connector housing 41 and used to partially receive the flexible circuit board 3. The circuit board receiving groove 55 and the circuit board receiving recess 414 together receive and protect a part where the end of the flexible circuit board 3 and the plurality of conductive terminals 42 are connected with each other.

Referring to FIG. 4, FIG. 5 and FIG. 11 to FIG. 13, furthermore, the end plate 71 at the right side of the battery receiving shell 7 is positioned below the bottom wall 51 of the connector box 5. The end plate 71 has a hollow structure and has a plurality of partitioning ribs 711 and a hollow groove 712 partitioned by the plurality of partitioning ribs 711, the bottom wall 51 of the connector box 5 has a protruding portion 511, and the protruding portion 511 is received in the hollow groove 712 of the end plate 71. The protruding portion 511 includes a first protruding portion 511a and a second protruding portion 511b, the bottom wall 51 of the connector 4 further has a limiting groove 512 defined by the first protruding portion 511a and the second protruding portion 511b together. The hollow groove 712 includes a first hollow groove 712a and a second hollow groove 712b which respectively receive the first protruding portion 511a and the second protruding portion 511b, the limiting groove 512 receives the partitioning rib 711 which is positioned between the first hollow groove 712a and the second hollow groove 712b. Specifically, the first protruding portion 511a constitutes a protruding structure having three sides, and the three sides together constitute a triangular contour, the first hollow groove 712a constitutes a groove structure having three sides and a triangular contour which substantially corresponds to the first protruding portion 511a; the second protruding portion 511b corresponds to one of the three sides of the first protruding portion 511a and forms a linear protruding structure; the limiting groove 512 defined by first protruding portion 511a and the second protruding portion 511b together is a strip groove structure. By corresponding cooperating relationships between the protruding portion 511 and the limiting groove 512 of the bottom wall 51 of the connector box 5 and the hollow groove 712 and the partitioning rib 711 of the end plate 71, the connector box 5 together with the carrying tray 1 can be better positioned, and at the same time, the endurance strength and stability of the connector box 5 are increased.

In conclusion, in the present disclosure, by the first holding structure 8 which is positioned between the connector housing 41 and the two side walls 52 of the connector box 5 and positioned in the front, the second holding structure 9 which is positioned between the rear supporter 413 of the connector housing 41 and the connector box 5 and positioned at the rear, and the third holding structure 10 which is positioned between the connector housing 41 and the connector box 5 and prevents the connector 4 from being detached via the upper opening 54, a complete and stable holding structure is constructed, the assembling strength and stability of the connector 4 assembled in the connector box 5 is increased. Furthermore, by corresponding cooperating relationships between the protruding portion 511 and the limiting groove 512 of the bottom wall 51 of the connector box 5 and the hollow groove 712 and the partitioning rib 711 of the end plate 71, the connector box 5 together with the carrying tray 1 can be better positioned, and at the same time, the endurance strength and stability of the connector box 5 are increased.

However, the above description is only for the embodiments of the present disclosure, and it is not intended to limit the implementing scope of the present disclosure, and the simple equivalent changes and modifications made according to the claims and the contents of the specification are still included in the scope of the present disclosure.

What is claimed is:

1. A battery connection module, comprising: a carrying tray; a plurality of busbars provided on the carrying tray; and a flexible circuit board provided on the carrying tray and electrically and mechanically connected to the plurality of busbars; a connector provided at an end of the flexible circuit board, the connector comprising a connector housing and a plurality of conductive terminals which are provided in the connector housing and are electrically and mechanically connected to the flexible circuit board, the connector housing having a mating portion at a front end thereof, a base at a rear end thereof and a rear supporter protruding rearwardly from a rear end surface of the base, the rear end surface of the base and the rear supporter together defining a circuit board receiving recess which is capable of partially receiving the flexible circuit board; a connector box integrally formed on one end of the carrying tray and configured to receive the connector, the connector box comprising a bottom wall and first and second side walls upstanding from opposite sides of the bottom wall, the first side wall extending between an end of the carrying tray and the bottom wall, the first and second side walls forming a front opening and an upper opening through which the connector passes to be assembled with the connector box, the mating portion extending outward from the front opening; and a first holding structure provided between the base of the connector housing and the first and second side walls of the connector box, a second holding structure provided between the rear supporter of the connector housing and the connector box, wherein during insertion of the connector housing into the connector box the first and second holding structures allow for movement of the connector housing relative to the connector box along a down direction through the upper opening while preventing movement of the connector housing relative to the connector box along a direction toward the front opening, and a third holding structure provided between the connector housing and the first and second side walls of the connector box, the third holding structure preventing movement of the connector housing relative to the connector box along an up direction when engaged.

2. The battery connection module of claim 1, wherein the second holding structure comprises a rear supporter receiving groove defined by the connector box and configured to receive the rear supporter.

3. The battery connection module of claim 2, wherein the second holding structure further comprises a recessed groove defined by a rear end of the rear supporter and a protruding bar formed in the rear supporter receiving groove and which correspondingly cooperates with the recessed groove.

4. The battery connection module of claim 2, wherein the first holding structure comprises two protruding rails extending from inner wall surfaces of the two side walls of the connector box and two protruding rail cooperate grooves defined in two side surfaces of the base and which correspondingly cooperate with the two protruding rails.

5. The battery connection module of claim 4, wherein lower ends of the two protruding rail cooperate grooves are open and upper ends of the two protruding rail cooperate grooves are closed.

6. The battery connection module of claim 1, wherein the third holding structure comprises a latching block extending from a side surface of the rear supporter and a latched hole in an inner wall surface of one of the side walls of the connector box and which correspondingly cooperates with the latching block.

7. The battery connection module of claim 1, wherein the connector box defines a circuit board receiving groove which is configured to partially receive the flexible circuit board.

8. The battery connection module of claim 1,
further comprising an end plate positioned below the bottom wall of the connector box, the end plate having a plurality of partitioning ribs defining a first hollow groove and a second hollow groove, and
the bottom wall of the connector box has a first protruding portion and a second protruding portion which are respectively received in the first hollow groove and the second hollow groove of the end plate, the first protruding portion and the second protruding portion defining a limiting groove which is configured to receive the partitioning rib which is between the first hollow groove and the second hollow groove.

9. The battery connection module of claim 8, wherein the first protruding portion has three sides, the first hollow groove has three sides, the second protruding portion is parallel to one of the three sides of the first protruding portion and forms a linear protruding structure.

10. A battery connection module, comprising: a carrying tray; a plurality of busbars on the carrying tray; and a flexible circuit board on the carrying tray and electrically and mechanically connected to the plurality of busbars; a connector provided at an end of the flexible circuit board, the connector comprising a connector housing and a plurality of conductive terminals which are provided in the connector housing and electrically and mechanically connected to the flexible circuit board; a connector box provided on one end of the carrying tray and being configured to receive the connector, the connector box comprising a bottom wall and first and second side walls, the first side wall extending between the one end of the carrying tray and the bottom wall, the first and second side walls forming a front opening and an upper opening through which the connector passes to be assembled with the connector box, the bottom wall of the connector box having a protruding portion; and a battery receiving shell configured to receive batteries therein, the battery receiving shell comprising first and second side plates having first and second end plates positioned at opposite ends thereof, wherein the first end plate is positioned below the bottom wall of the connector box, the end plate having a hollow structure and having a plurality of partitioning ribs forming a hollow groove, the protruding portion of the connector box being received within the hollow groove of the end plate, and wherein the carrying tray seats on the battery receiving shell.

11. The battery connection module of claim 10, wherein the protruding portion comprises a first protruding portion and a second protruding portion, wherein the first protruding portion and the second protruding portion on the bottom wall of the connector define a limiting groove therebetween,
the hollow groove comprises a first hollow groove and a second hollow groove which respectively receive the first protruding portion and the second protruding portion, and
the limiting groove receives the partitioning rib which is between the first hollow groove and the second hollow groove.

12. The battery connection module of claim 11, wherein the first protruding portion comprises a protruding structure having three sides, the first hollow groove constitutes a groove structure having three sides.

13. The battery connection module of claim 12, wherein the second protruding portion corresponds to one of the three sides of the first protruding portion and forms a linear protruding structure.

14. The battery connection module of claim 10, further comprising a first holding structure provided between the connector housing and the first and second side walls of the connector box, a second holding structure provided between the connector housing and the connector box, wherein during insertion of the connector housing into the connector box the first and second holding structures allow for movement of the connector housing relative to the connector box along a down direction through the upper opening while preventing movement of the connector housing relative to the connector box along a direction toward the front opening, and a third holding structure provided between the connector and the connector box, the third holding structure preventing movement of the connector housing relative to the connector box along an up direction when engaged.

15. The battery connection module of claim 14, wherein the second holding structure includes a groove and a cooperating protruding bar.

16. The battery connection module of claim 14, wherein the first holding structure includes grooves and cooperating rails.

17. The battery connection module of claim 1, wherein the second holding structure includes a groove and a cooperating protruding bar.

18. The battery connection module of claim 1, wherein the first holding structure includes grooves and cooperating rails.

19. The battery connection module of claim 3, wherein the first holding structure comprises two protruding rails extending from inner wall surfaces of the first and second side walls of the connector box and two protruding rail cooperate grooves defined in two side surfaces of the base and which correspondingly cooperate with the two protruding rails.

20. The battery connection module of claim 19, wherein lower ends of the two protruding rail cooperate grooves are open and upper ends of the two protruding rail cooperate grooves are closed.

* * * * *